United States Patent
Hokaku et al.

(10) Patent No.: US 10,685,856 B2
(45) Date of Patent: Jun. 16, 2020

(54) SUBSTRATE PROCESSING METHOD AND SUBSTRATE PROCESSING APPARATUS

(71) Applicant: SCREEN Holdings Co., Ltd., Kyoto (JP)

(72) Inventors: Ryohei Hokaku, Kyoto (JP); Junichi Ishii, Kyoto (JP); Takashi Shinohara, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 144 days.

(21) Appl. No.: 15/866,606

(22) Filed: Jan. 10, 2018

(65) Prior Publication Data

US 2018/0261474 A1 Sep. 13, 2018

(30) Foreign Application Priority Data

Mar. 9, 2017 (JP) .................................. 2017-045085

(51) Int. Cl.
*H01L 21/67* (2006.01)
*B08B 1/04* (2006.01)

(52) U.S. Cl.
CPC .......... *H01L 21/67046* (2013.01); *B08B 1/04* (2013.01); *H01L 21/67051* (2013.01); *H01L 21/67109* (2013.01)

(58) Field of Classification Search
CPC ................. B08B 1/04; H01L 21/67046; H01L 21/67051; H01L 21/67109
USPC .......... 134/18, 26, 33; 156/345.12; 451/259, 451/287, 56
See application file for complete search history.

(56) References Cited

U.S. PATENT DOCUMENTS

| 10,201,888 | B2* | 2/2019 | Yamaguchi | ....... H01L 21/67046 |
| 2001/0035197 | A1* | 11/2001 | Brown | ....................... B08B 1/04 |
| | | | | 134/6 |
| 2013/0206171 | A1* | 8/2013 | Kurusu | ................. H01L 21/304 |
| | | | | 134/6 |
| 2016/0059376 | A1* | 3/2016 | Yamaguchi | ............. B24B 37/04 |
| | | | | 451/287 |
| 2016/0101498 | A1* | 4/2016 | Yamaguchi | ....... H01L 21/67051 |
| | | | | 451/41 |
| 2018/0151343 | A1* | 5/2018 | Takiguchi | ......... H01L 21/67046 |

FOREIGN PATENT DOCUMENTS

| JP | H07-45955 Y | 10/1995 |
| JP | H09-266187 A | 10/1997 |
| JP | 2006-339434 A | 12/2006 |

(Continued)

*Primary Examiner* — Nadine G Norton
*Assistant Examiner* — Christopher Remavege
(74) *Attorney, Agent, or Firm* — Ostrolenk Faber LLP

(57) ABSTRACT

While a substrate is being rotated, the lower surface of a brush is moved along the upper surface of the substrate. The brush and a spray nozzle are moved upward from a takeoff position to a lower non-contact position so as to separate the lower surface of the brush from the upper surface of the substrate. The spray nozzle generates the droplets in a state where the brush and the spray nozzle are located in the lower non-contact position so as to make the droplets collide with the upper surface of the substrate, and then the droplets colliding with the upper surface of the substrate are discharged from a gap between the lower surface of the brush and the upper surface of the substrate while the droplets are being supplied to the lower surface of the brush.

16 Claims, 9 Drawing Sheets

(56) References Cited

FOREIGN PATENT DOCUMENTS

| JP | 2009-231628 A | 10/2009 |
| JP | 2010-109225 A | 5/2010 |
| JP | 2015-019024 A | 1/2015 |

\* cited by examiner

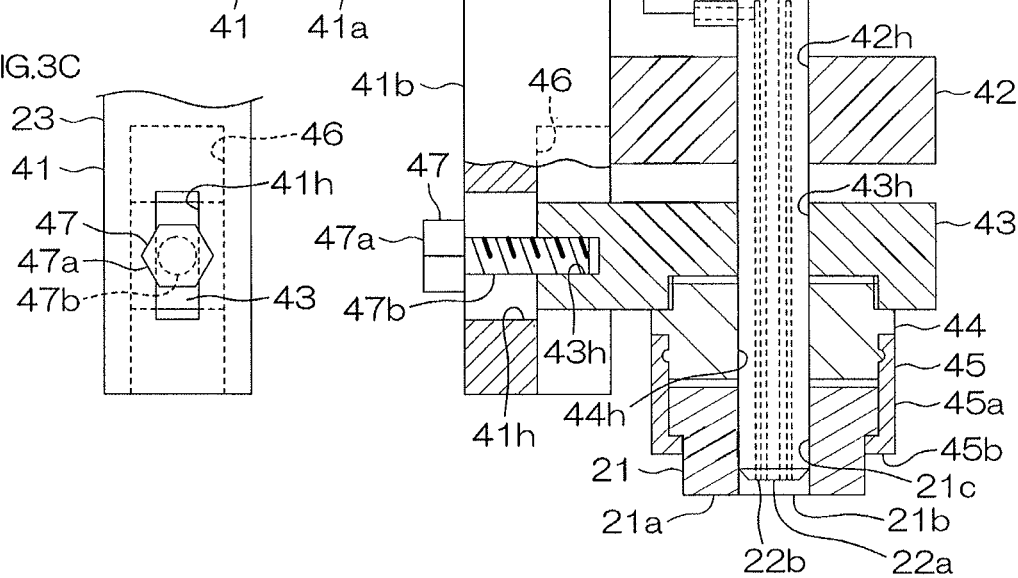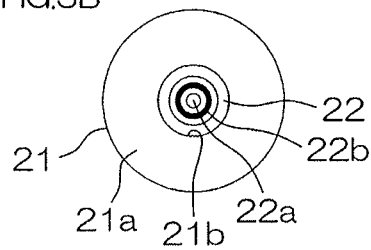

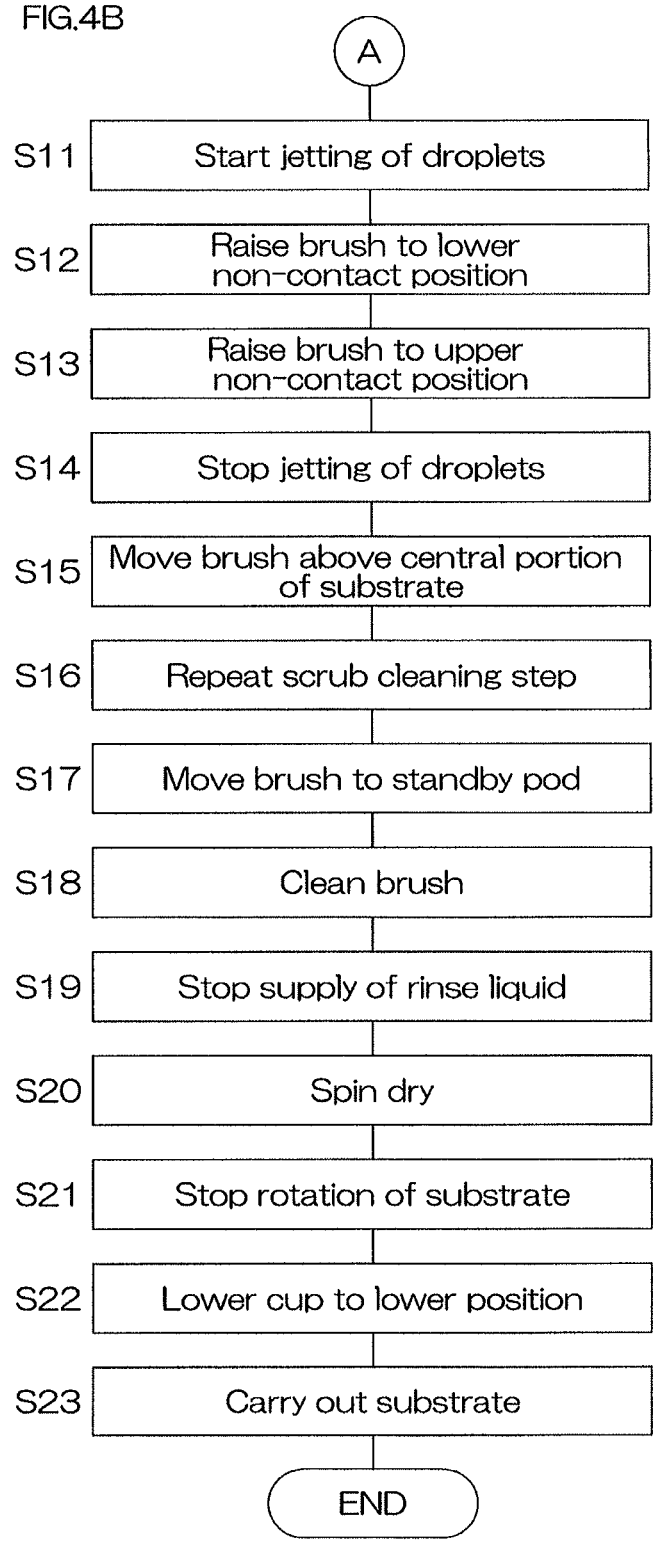

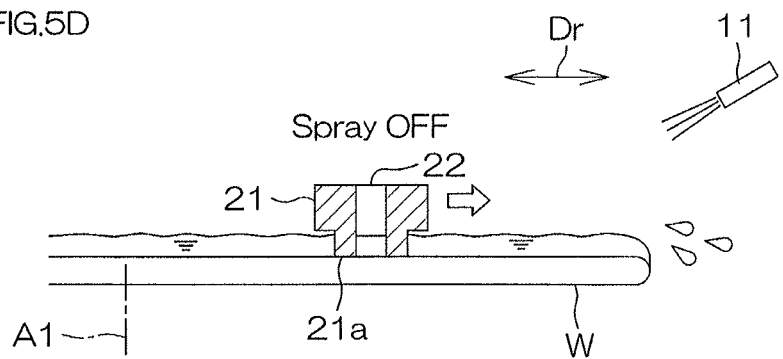
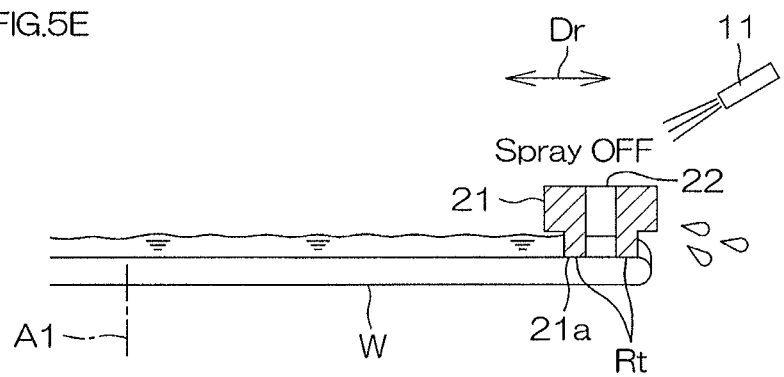
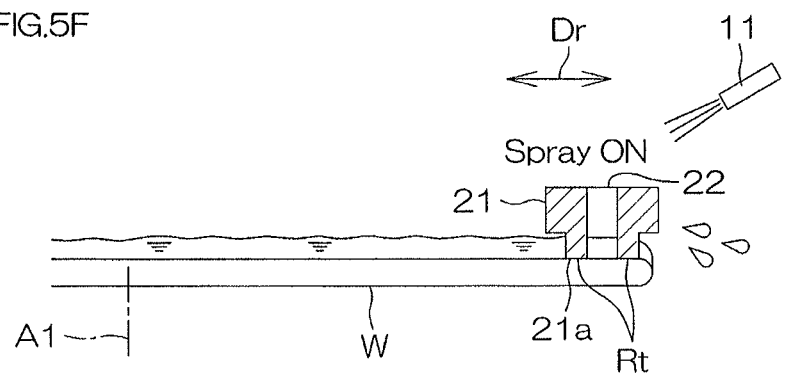

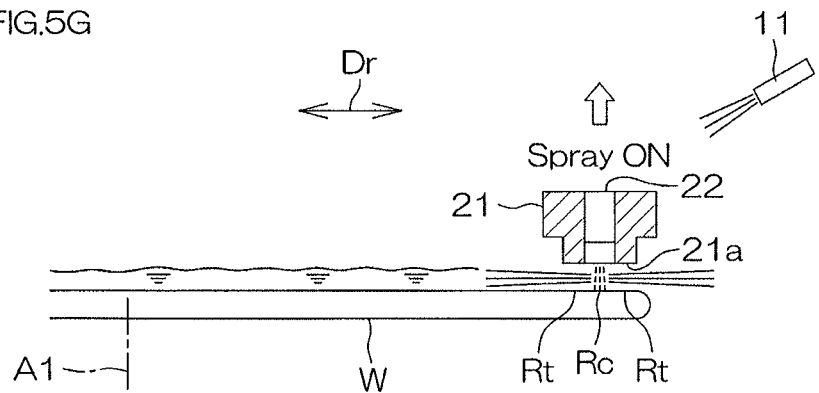
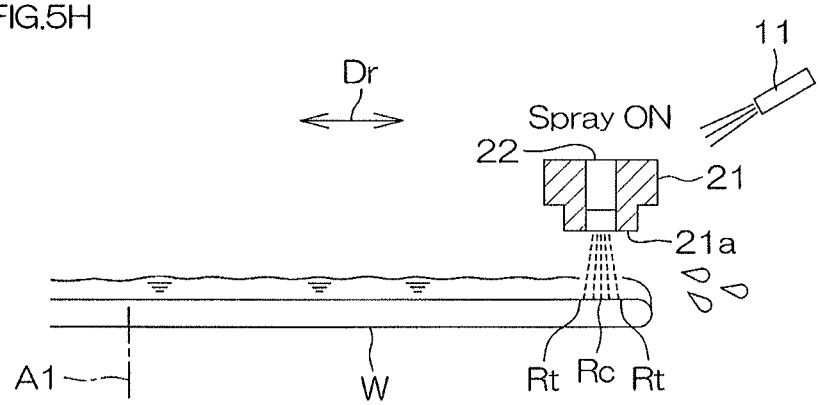
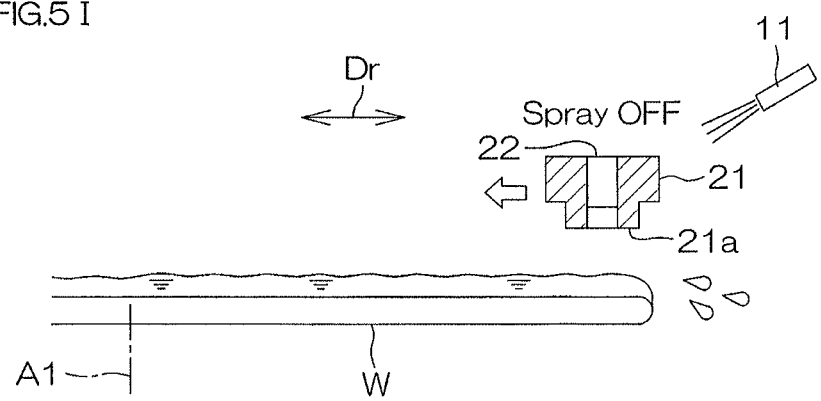

Brush movement direction ←

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus which process a substrate. Substrates to be processed include, for example, semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of Related Art

In manufacturing processes for semiconductor devices and liquid crystal displays, substrate processing apparatuses are used for processing substrates such as semiconductor wafers or glass panels for liquid crystal displays.

JP 2015-19024 A discloses a single substrate processing type substrate processing apparatus which performs scrub cleaning. A brush is first pressed against a central portion of the upper surface of a substrate. Thereafter, the brush is moved between the central portion of the upper surface of the substrate and an outer circumferential portion of the upper surface of the substrate. Then, the brush is moved upward from the outer circumferential portion of the upper surface of the substrate so as to be separated from the upper surface of the substrate. After the brush is separated from the substrate, in order for the substrate to be dried, the substrate is rotated at a high speed, and thus a liquid on the substrate such as pure water is shaken off around the surroundings of the substrate. The brush separated from the substrate is cleaned in a standby pod so as to be on standby for the subsequent cleaning of the substrate.

In JP 2015-19024 A, the brush is first brought into contact with the central portion of the upper surface of the substrate, and then the brush is separated upward from the outer circumferential portion of the upper surface of the substrate. In the processing described above, a brush mark may be left on the central portion of the upper surface of the substrate and the outer circumferential portion of the upper surface of the substrate. FIG. 8 shows an example of the brush mark left on the central portion of the upper surface of the substrate and the outer circumferential portion of the upper surface of the substrate. This means that contamination is left on the central portion of the upper surface of the substrate and the outer circumferential portion of the upper surface of the substrate.

The central portion of the upper surface of the substrate is a region with which the brush is first brought into contact. The outer circumferential portion of the upper surface of the substrate is a region from which the brush is separated. It can be considered that the cause of the contamination left on the central portion of the upper surface of the substrate is that when the brush is pressed against the substrate, contamination left on the brush is transferred to the substrate. It can be considered that the cause of the contamination left on the outer circumferential portion of the upper surface of the surface is that when the brush is separated upward from the substrate, contamination collected on the lower surface of the brush during the scrub cleaning is left on the substrate.

SUMMARY OF THE INVENTION

A preferred embodiment of the present invention provides a substrate processing method performed by a substrate processing apparatus including: a brush which includes a lower surface that is pressed against an upper surface of a substrate held horizontally, a central opening that is open in a central portion of the lower surface and a nozzle insertion hole that is extended upward from the central opening; and a spray nozzle which is inserted into the nozzle insertion hole and which generates a plurality of droplets that are scattered toward the upper surface of the substrate through the central opening.

The substrate processing method includes: a brush landing step of moving the brush and the spray nozzle downward to a landing position so as to bring the lower surface of the brush into contact with the upper surface of the substrate; a scrub cleaning step of moving, while rotating the substrate about a vertical rotation axis passing through a central portion of the substrate, the brush and the spray nozzle from the landing position to a takeoff position in a horizontal radial direction orthogonal to the rotation axis so as to move the lower surface of the brush along the upper surface of the substrate; a brush takeoff step of moving the brush and the spray nozzle upward from the takeoff position to a lower non-contact position so as to separate the lower surface of the brush from the upper surface of the substrate; and a takeoff spray step of making the spray nozzle generate the droplets in a state where the brush and the spray nozzle are located in the lower non-contact position so as to make the droplets collide with the upper surface of the substrate, and then discharging the droplets colliding with the upper surface of the substrate from a gap between the lower surface of the brush and the upper surface of the substrate while supplying the droplets to the lower surface of the brush.

With this arrangement, the brush and the spray nozzle are moved downward toward the landing position. Thereby, the lower surface of the brush approaches the upper surface of the substrate and then comes into contact with the landing region within the upper surface of the substrate. Thereafter, in a state where the substrate is rotated about the vertical rotation axis, and where the lower surface of the brush is in contact with the upper surface of the substrate, the brush is moved from the landing position to the take-off position in the radial direction. Thereby, the lower surface of the brush is scrubbed on the upper surface of the substrate, and thus the upper surface of the substrate is cleaned with the brush.

Thereafter, the brush and the spray nozzle are moved upward from the takeoff position to the lower non-contact position. Thereby, the lower surface of the brush is separated from the takeoff region within the upper surface of the substrate. In this state, the spray nozzle generates the droplets. The droplets are passed downward through the central opening which is open in the lower surface of the brush so as to collide with the takeoff region within the upper surface of the substrate. The contamination left on the takeoff region when the brush is separated from the substrate is removed from the substrate due to an impact caused by the collision of the droplets.

The droplets generated by the spray nozzle collide with the upper surface of the substrate, and are thereafter passed outward through the gap between the lower surface of the brush and the upper surface of the substrate. Some of the liquid which is passed through the gap is supplied to the lower surface of the brush. Thereby, the contamination adhering to the lower surface of the brush is cleaned away. Furthermore, the droplets collide with the collision region within the upper surface of the substrate, and flow radially from the collision region along the upper surface of the substrate. In other words, the liquid that has collided with the substrate flows from the collision region in a plurality of directions extending radially. Hence, as compared with a case where the liquid flows only in one direction, the contamination can be removed from a wider range within the lower surface of the brush.

As described above, since the contamination adhering to the lower surface of the brush is removed and the remaining amount of the contamination is reduced, it is possible to reduce the amount of contamination transferred from the lower surface of the brush to the landing region within the upper surface of the substrate. Furthermore, since the lower surface of the brush is separated from the upper surface of the substrate, and thereafter the droplets collide with the takeoff region within the upper surface of the substrate, it is possible to reduce the remaining amount of contamination on the takeoff region. Thereby, it is possible to reduce the remaining amount of contamination on the upper surface of the substrate and to enhance the cleanliness of the substrate.

In the preferred embodiment, at least one of the following features may be added to the substrate processing method.

The takeoff spray step includes a before-takeoff spray start step of making the spray nozzle start the generation of the droplets before the brush and the spray nozzle are moved upward from the takeoff position. In the before-takeoff spray start step, the spray nozzle may be made to start the generation of the droplets in a state where the brush and the spray nozzle are located in the landing position or the spray nozzle may be made to start the generation of the droplets before the brush and the spray nozzle reach the landing position.

With this arrangement, in a state where the lower surface of the brush is in contact with the upper surface of the substrate, the spray nozzle generates the droplets. When the lower surface of the brush is in contact with the upper surface of the substrate, since the central opening which is open in the lower surface of the brush is closed by the upper surface of the substrate, the droplets are generated within the nozzle insertion hole, and thus the pressure within the nozzle insertion hole is increased. Hence, the lower surface of the brush is separated upward from the upper surface of the substrate in a state where the pressure within the nozzle insertion hole is high.

When the lower surface of the brush is separated from the upper surface of the substrate, the liquid within the nozzle insertion hole is discharged by the pressure within the nozzle insertion hole downward from the central opening of the brush and is scattered radially through the gap between the lower surface of the brush and the upper surface of the substrate. The liquid which is rapidly passed through the gap between the brush and the substrate collides with the contamination adhering to the lower surface of the brush and the upper surface of the substrate. Thereby, it is possible to remove the contamination adhering to the lower surface of the brush and the upper surface of the substrate, and thus it is possible to reduce the remaining amount of contamination thereon.

The substrate processing method includes: a brush raising step of moving the brush and the spray nozzle upward from the lower non-contact position to an upper non-contact position; and an after-takeoff spray step of making the spray nozzle generate the droplets in a state where the brush and the spray nozzle are located in the upper non-contact position.

With this arrangement, while the brush and the spray nozzle are located in the upper non-contact position above the lower non-contact position, the droplets are generated by the spray nozzle. In general, the droplets are not scattered linearly from the lower end portion of the spray nozzle but scattered downward while being extended conically from the lower end portion of the spray nozzle. As the spray nozzle is moved away from the substrate, the outside diameter of the collision region within the upper surface of the substrate with which the droplets collide is increased. Hence, the spray nozzle is located in the upper non-contact position, and thus it is possible to make the droplets collide with a wider range within the upper surface of the substrate and to reduce the amount of contamination transferred from the lower surface of the brush to the upper surface of the substrate.

The substrate processing method further includes a moving spray step of moving the brush and the spray nozzle in the radial direction while making the spray nozzle generate the droplets in a state where the brush and the spray nozzle is disposed above a take-off region within the upper surface of the substrate in which the lower surface of the brush is separated upward from the upper surface of the substrate. In the moving spray step, the brush and the spray nozzle may be moved in the radial direction within a range in which at least a portion of the brush overlaps the takeoff region in a plan view.

With this arrangement, in a state where the lower surface of the brush is separated upward from the takeoff region within the upper surface of the substrate, the droplets are generated by the spray nozzle, and the brush and the spray nozzle are moved in the radial direction. The collision region within the upper surface of the substrate with which the droplets collide is moved in the radial direction as the spray nozzle is moved. Thereby, it is possible to make the droplets collide with a wider range within the upper surface of the substrate including the take-off region, and thus it is possible to further reduce the remaining amount of contamination on the takeoff region.

The substrate processing method further includes a landing spray step of moving the brush and the spray nozzle from the landing position toward the takeoff position in the radial direction while making the spray nozzle generate the droplets.

With this arrangement, while the droplets are being generated by the spray nozzle, the brush and the spray nozzle are moved from the landing position toward the takeoff position in the radial direction. When the brush is located in the landing position, the lower surface of the brush is in contact with the landing region within the upper surface of the substrate. Here, the contamination left on the lower surface of the brush can be transferred to the landing region. The collision region within the upper surface of the substrate with which the droplets collide overlaps the landing region as the spray nozzle is moved in the radial direction. The contamination transferred from the brush to the landing region is removed due to the impact caused by the collision of the droplets. Thereby, it is possible to reduce the remaining amount of contamination on the upper surface of the substrate and to enhance the cleanliness of the substrate.

The landing spray step is a step of making the spray nozzle generate the droplets at least until a collision region within the upper surface of the substrate with which the droplets collide reaches an outer edge of a landing region within the upper surface of the substrate with which the lower surface of the brush is brought into contact when the brush and the spray nozzle are arranged in the landing position.

With this arrangement, the collision region with which the droplets collide is moved in the radial direction within the upper surface of the substrate. The landing region with which the lower surface of the brush is brought into contact when the brush and the spray nozzle are arranged in the landing position is an annular region that surrounds the collision region. The collision region is passed through the inner edge of the landing position as the spray nozzle is moved in the radial direction. The generation of the droplets is continued at least until the collision region reaches the outer edge of the landing region. Hence, it is possible to make the droplets collide with each portion of the landing region, and thus it is possible to reduce the remaining amount of contamination on the upper surface of the substrate.

The landing spray step includes a before-landing spray start step of making the spray nozzle start the generation of the droplets before the brush and the spray nozzle are moved to the landing position.

With this arrangement, before the brush is brought into contact with the upper surface of the substrate, the spray nozzle starts the generation of the droplets. In this state, the brush and the spray nozzle are lowered to the landing position. Furthermore, the brush and the spray nozzle are moved from the landing position toward the takeoff position in the radial direction. Hence, as compared with a case where the generation of the droplets is started after the brush and the spray nozzle are moved to the landing position, the brush and the spray nozzle can be smoothly moved from the landing position to the takeoff position.

The scrub cleaning step includes a spray-stop scrub cleaning step of moving the brush and the spray nozzle in the radial direction while making the spray nozzle stop the generation of the droplets in at least a portion of a range from the landing position to the takeoff position.

With this arrangement, in a state where the lower surface of the brush is in contact with the upper surface of the substrate, and where the spray nozzle stops the generation of the droplets, the brush and the spray nozzle are moved in the radial direction. When the spray nozzle generates droplets while the lower surface of the brush is in contact with the upper surface of the substrate, the pressure within the nozzle insertion hole provided in the brush is increased and a force which raises the brush from the substrate can be generated. This means that a force which presses the brush against the substrate is reduced. Hence, while the generation of the droplets is stopped, the brush is pressed against the upper surface of the substrate, and thus it is possible to reduce or prevent the lowering of the removal rate of the contamination.

The substrate processing method further includes a fluid discharge step of discharging a fluid within the nozzle insertion hole through an escape hole which is extended from an inner circumferential surface of the nozzle insertion hole to an outer surface of the brush.

The outer surface of the brush means the surfaces other than the lower surface of the brush. The outer surface of the brush may be the outer circumferential surface of the brush coaxial with the inner circumferential surface of the nozzle insertion hole, the upper surface of the brush or a surface other than those described above. The escape hole may be opened both in the outer surface of the brush and in the lower surface thereof. When the brush is a sponge having micropores, the inside diameter of the escape hole is larger than that of the micropore.

With this arrangement, the fluid within the nozzle insertion hole provided in the brush is discharged to the outside of the brush not through the central opening of the brush but through the escape hole. Hence, even when the droplets are generated by the spray nozzle while the lower surface of the brush is in contact with the upper surface of the substrate, it is unlikely that the pressure within the nozzle insertion hole is increased. Thereby, it is possible to reduce or prevent a lowering in the detergency of the brush.

Another preferred embodiment of the present invention provides a substrate processing apparatus including: a substrate holding unit which rotates, while holding a substrate horizontally, the substrate about a vertical rotation axis passing through a central portion of the substrate; a brush which includes a lower surface that is pressed against an upper surface of the substrate held by the substrate holding unit, a central opening that is open in a central portion of the lower surface and a nozzle insertion hole that is extended upward from the central opening; a spray nozzle which is inserted into the nozzle insertion hole and which generates a plurality of droplets that are scattered through the central opening toward the upper surface of the substrate held by the substrate holding unit; a drive mechanism which moves the brush and the spray nozzle; and a controller which controls the spray nozzle and the drive mechanism.

The controller performs: a brush landing step of making the drive mechanism move the brush and the spray nozzle downward to a landing position so as to bring the lower surface of the brush into contact with the upper surface of the substrate held by the substrate holding unit; a scrub cleaning step of making, while making the substrate holding unit rotate the substrate about the rotation axis, the drive mechanism move the brush and the spray nozzle from the landing position to a takeoff position in a horizontal radial direction orthogonal to the rotation axis so as to move the lower surface of the brush along the upper surface of the substrate held by the substrate holding unit; a brush takeoff step of making the drive mechanism move the brush and the spray nozzle upward from the takeoff position to a lower non-contact position so as to separate the lower surface of the brush from the upper surface of the substrate held by the substrate holding unit; and a takeoff spray step of making the spray nozzle generate the droplets in a state where the brush and the spray nozzle are located in the lower non-contact position so as to make the droplets collide with the upper surface of the substrate held by the substrate holding unit, and then discharging the droplets colliding with the upper surface of the substrate from a gap between the lower surface of the brush and the upper surface of the substrate while supplying the droplets to the lower surface of the brush.

With this arrangement, it is possible to obtain the same operations and effects as those described above. Specifically, according to this configuration, the brush and the spray nozzle are moved downward toward the landing position. Thereby, the lower surface of the brush approaches the upper surface of the substrate and then comes into contact with the landing region within the upper surface of the substrate. Thereafter, in a state where the substrate is rotated about the vertical rotation axis, and where the lower surface of the brush is brought into contact with the upper surface of the substrate, the brush is moved from the landing position to the take-off position in the radial direction. Thereby, the lower surface of the brush is scrubbed on the upper surface of the substrate, and thus the upper surface of the substrate is cleaned with the brush.

Thereafter, the brush and the spray nozzle are moved upward from the takeoff position to the lower non-contact position. Thereby, the lower surface of the brush is separated from the takeoff region within the upper surface of the substrate. In this state, the spray nozzle generates the droplets. The droplets are passed downward through the central opening which is open in the lower surface of the brush so as to collide with the takeoff region within the upper surface of the substrate. The contamination left on the takeoff region when the brush is separated from the substrate is removed from the substrate due to an impact caused by the collision of the droplets.

The droplets generated by the spray nozzle collide with the upper surface of the substrate, and are thereafter passed outward through the gap between the lower surface of the brush and the upper surface of the substrate. Some of the liquid which is passed through the gap is supplied to the lower surface of the brush. Thereby, the contamination adhering to the lower surface of the brush is cleaned away. Furthermore, the droplets collide with the collision region within the upper surface of the substrate, and are thereafter extended radially from the collision region. In other words, the liquid colliding with the substrate is extended from the collision region in a plurality of directions. Hence, as compared with a case where the liquid flows only in one direction, the contamination can be removed from a wider range within the lower surface of the brush.

As described above, the contamination adhering to the lower surface of the brush can be cleaned away such that the remaining amount of contamination can be reduced, when the brush is brought into contact with the subsequent substrate, it is possible to reduce the amount of contamination transferred from the lower surface of the brush to the landing region within the upper surface of the substrate. Furthermore, since the lower surface of the brush is separated from the upper surface of the substrate, and thereafter the droplets collide with the takeoff region within the upper surface of the substrate, it is possible to reduce the remaining amount of contamination on the takeoff region. Thereby, it is possible to reduce the remaining amount of contamination on the upper surface of the substrate and to enhance the cleanliness of the substrate.

In the preferred embodiment, at least one of the following features may be added to the substrate processing apparatus.

The takeoff spray step includes a before-takeoff spray start step of making the spray nozzle start the generation of the droplets before the brush and the spray nozzle are moved upward from the takeoff position. With this arrangement, it is possible to obtain the same operations and effects as those described above.

The controller further performs a brush raising step of making the drive mechanism move the brush and the spray nozzle upward from the lower non-contact position to an upper non-contact position and an after-takeoff spray step of making the spray nozzle generate the droplets in a state where the brush and the spray nozzle are located in the upper non-contact position. With this arrangement, it is possible to obtain the same operations and effects as those described above.

The controller further performs a moving spray step of making the drive mechanism move the brush and the spray nozzle in the radial direction while making the spray nozzle generate the droplets in a state where the brush and the spray nozzle is disposed above a take-off region within the upper surface of the substrate in which the lower surface of the brush is separated upward from the upper surface of the substrate. With this arrangement, it is possible to obtain the same operations and effects as those described above.

The controller further performs a landing spray step of making the drive mechanism move the brush and the spray nozzle from the landing position toward the takeoff position in the radial direction while making the spray nozzle generate the droplets. With this arrangement, it is possible to obtain the same operations and effects as those described above.

The landing spray step is a step of making the spray nozzle generate the droplets at least until a collision region within the upper surface of the substrate with which the droplets collide reaches an outer edge of a landing region within the upper surface of the substrate with which the lower surface of the brush is brought into contact when the brush and the spray nozzle are arranged in the landing position. With this arrangement, it is possible to obtain the same operations and effects as those described above.

The landing spray step includes a before-landing spray start step of making the spray nozzle start the generation of the droplets before the brush and the spray nozzle are moved to the landing position. With this arrangement, it is possible to obtain the same operations and effects as those described above.

The scrub cleaning step includes a spray-stop scrub cleaning step of making the drive mechanism move the brush and the spray nozzle in the radial direction while making the spray nozzle stop the generation of the droplets in at least a portion of a range from the landing position to the takeoff position. With this arrangement, it is possible to obtain the same operations and effects as those described above.

The brush further includes an escape hole which is extended from an inner circumferential surface of the nozzle insertion hole to an outer surface of the brush. With this arrangement, it is possible to obtain the same operations and effects as those described above.

The above and other objects, features, and effects of the present invention will become more apparent from the following detailed description of the preferred embodiments with reference to the attached drawings.

BRIEF DESCRIPTION OF THE DRAWINGS

FIG. 3A is a partial cross-sectional view of a brush and a spray nozzle, viewed horizontally.

FIG. 3B is a schematic view of the brush, viewed vertically from below.

FIG. 3C is a schematic view of a movable arm, viewed in an axial direction of a bolt.

FIG. 4B is a process diagram for describing the example of the processing of the substrate performed by the substrate processing apparatus.

FIG. 5D is a schematic view showing the state of the substrate when the processing is being performed.

FIG. 5E is a schematic view showing the state of the substrate when the processing is being performed.

FIG. 5F is a schematic view showing the state of the substrate when the processing is being performed.

FIG. 5G is a schematic view showing the state of the substrate when the processing is being performed.

FIG. 5H is a schematic view showing the state of the substrate when the processing is being performed.

FIG. 5I is a schematic view showing the state of the substrate when the processing is being performed.

DETAILED DESCRIPTION OF THE PREFERRED EMBODIMENTS

Figure 1:
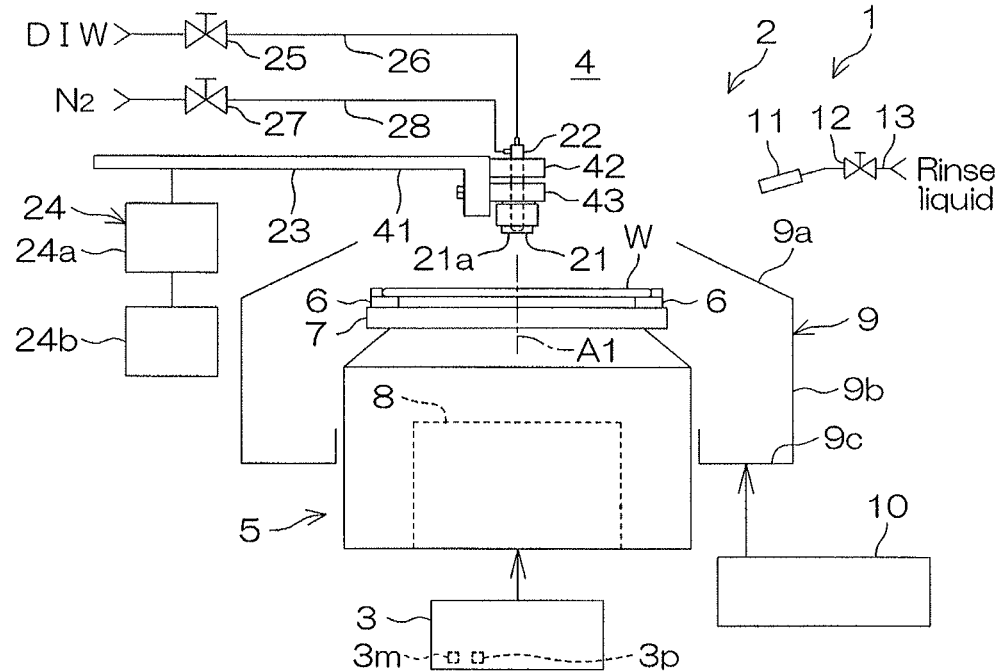
FIG. 1 is a schematic horizontal view of an interior of a processing unit included in a substrate processing apparatus according to a preferred embodiment of the present invention.
Figure 2:
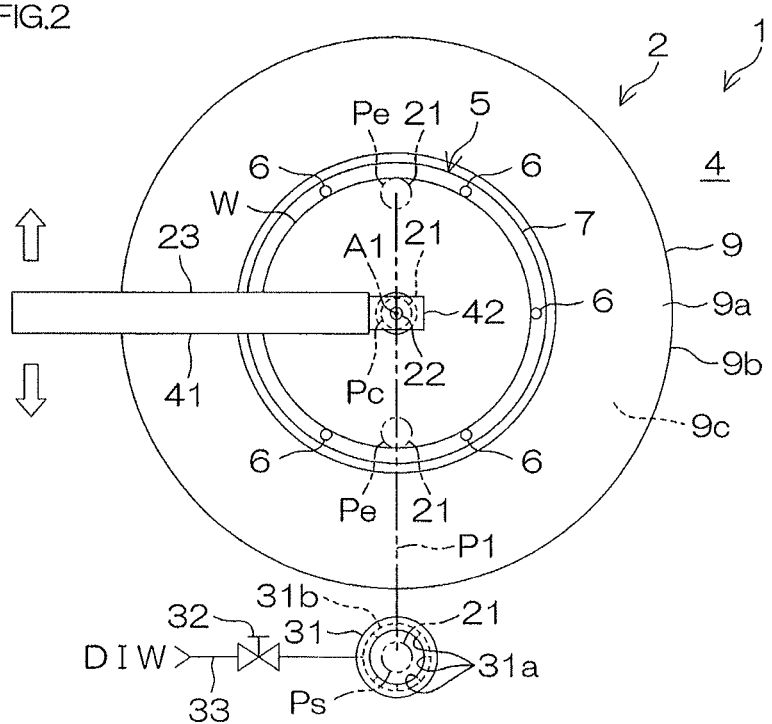
FIG. 2 is a schematic view of the interior of the processing unit, viewed vertically from above.

FIG. 1 is a schematic horizontal view of an interior of a processing unit 2 included in a substrate processing apparatus 1 according to a preferred embodiment of the present invention. FIG. 1 shows a state where a brush 21 and a spray nozzle 22 are arranged in a central upper position. FIG. 2 is a schematic view of the interior of the processing unit 2, viewed vertically from above. FIGS. 3A, 3B and 3C are schematic views of the brush 21 and the spray nozzle 22.

As shown in FIG. 1, the substrate processing apparatus 1 is a single substrate processing type apparatus which processes disc-shaped substrates W such as a semiconductor wafer one by one. The substrate processing apparatus 1 includes a plurality of processing units 2 which process the substrate W with a processing fluid such as a processing liquid or a processing gas, a transfer robot (unillustrated) which transfers the substrate W to the processing units 2 and a controller 3 which controls the substrate processing apparatus 1. The controller 3 is a computer which includes a memory 3m that stores information such as programs and a processor 3p that controls the substrate processing apparatus 1 according to the information stored in the memory 3m.

The processing unit 2 includes a box-shaped chamber 4 which has an internal space, a spin chuck 5 which rotates the substrate W about a vertical rotation axis A1 passing through a central portion of the substrate W while holding the substrate W horizontally within the chamber 4 and a tubular cup 9 which receives the processing liquid discharged outward from the substrate W held by the spin chuck 5. The spin chuck 5 is an example of a substrate holding unit.

The spin chuck 5 includes a disc-shaped spin base 7 which is held in a horizontal posture, a plurality of check pins 6 which hold the substrate W above the spin base 7 in the horizontal posture and a spin motor 8 which rotates the substrate W about the rotation axis A1 by rotating the spin base 7 and the check pins 6. The spin chuck 5 is not limited to a clamping type chuck which brings the check pins 6 into contact with the outer circumferential surface of the substrate W, and may be a vacuum type chuck which holds the substrate W horizontally by sucking the rear surface (lower surface) of the substrate W that is a non-device definition surface to the upper surface of the spin base 7.

The cup 9 includes a tubular guide portion 9b which surrounds the spin chuck 5, a tubular inclined portion 9a which is extended obliquely upward from the upper end portion of the guide portion 9b toward the rotation axis A1 and a liquid receiving portion 9c which defines, together with the guide portion 9b, an annular groove that is opened upward. As shown in FIG. 2, the inclined portion 9a includes an annular upper end which has an inside diameter larger than the substrate W and the spin base 7. The upper end of the inclined portion 9a corresponds to the upper end of the cup 9. The upper end of the cup 9 surrounds the substrate W and the spin base 7 in a plan view.

As shown in FIG. 1, the processing unit 2 includes a cup raising/lowering unit 10 that vertically raises and lowers the cup 9 between an upper position (position shown in FIG. 1) where the upper end of the cup 9 is located higher than a holding position in which the spin chuck 5 holds the substrate W and a lower position where the upper end of the cup 9 is located lower than the holding position. When the processing liquid is supplied to the substrate W, the cup 9 is arranged in the upper position. The processing liquid scattered outward from the substrate W is received by the inclined portion 9a, and is then collected by the guide portion 9b into the liquid receiving portion 9c.

The processing unit 2 includes a rinse liquid nozzle 11 which discharges the rinse liquid downward toward the upper surface of the substrate W held by the spin chuck 5. The rinse liquid nozzle 11 is connected to a rinse liquid pipe 13 in which a rinse liquid valve 12 is interposed. The rinse liquid nozzle 11 is fixed in a predetermined position within the chamber 4. The processing unit 2 may include a nozzle movement unit which moves the rinse liquid nozzle 11 horizontally between a processing position where the rinse liquid discharged from the rinse liquid nozzle 11 is supplied to the substrate W and a standby position where the rinse liquid nozzle 11 is separated from the substrate W in a plan view.

When the rinse liquid valve 12 is opened, the rinse liquid is supplied from the rinse liquid pipe 13 to the rinse liquid nozzle 11 and is discharged from the rinse liquid nozzle 11. The rinse liquid is, for example, pure water (deionized water). The rinse liquid is not limited to pure water, and may be any one of carbonated water, electrolyzed ionic water, hydrogen water, ozone water and hydrochloric acid water of a diluted concentration (for example, about 10 to 100 ppm).

The processing unit 2 includes the brush 21 which is pressed against the upper surface of the substrate W held by the spin chuck 5 and the spray nozzle 22 which makes a plurality of droplets collide with the upper surface of the substrate W held by the spin chuck 5. The processing unit 2 further includes a movable arm 23 which holds the brush 21 and the spray nozzle 22 and a drive mechanism 24 which moves the movable arm 23. The drive mechanism 24 includes a vertical drive mechanism 24a which moves the movable arm 23 vertically and a horizontal drive mechanism 24b which moves the movable arm 23 horizontally by moving the vertical drive mechanism 24a horizontally.

The spray nozzle 22 is, for example, a two-fluid nozzle which makes a liquid and a gas collide with each other within the spray nozzle or outside the spray nozzle so as to generate a plurality of droplets that are scattered downward toward the upper surface of the substrate W. FIG. 3A shows an example where the spray nozzle 22 is an externally mixing type two-fluid nozzle. The spray nozzle 22 includes a liquid discharge port 22a through which the liquid is discharged toward the upper surface of the substrate W and a gas discharge port 22b through which a gas colliding with the liquid discharged from the liquid discharge port 22a is discharged. The liquid discharge port 22a and the gas discharge port 22b are provided at a lower end portion of the spray nozzle 22. The lower end portion of the spray nozzle 22 is arranged within the brush 21. The liquid discharge port 22a is formed in the shape of a circle which overlaps the center line of the spray nozzle 22, and the gas discharge port 22b is formed in the shape of a ring which surrounds the liquid discharge port 22a.

The spray nozzle 22 is connected to a liquid pipe 26 which guides the liquid supplied to the spray nozzle 22 and to a gas pipe 28 which guides the gas supplied to the spray nozzle 22. A liquid valve 25 which switches between the supply of the liquid to the spray nozzle 22 and the stop of the supply is interposed in the liquid pipe 26. A gas valve 27 which switches between the supply of the gas to the spray nozzle 22 and the stop of the supply is interposed in the gas pipe 28. The liquid supplied to the spray nozzle 22 is, for example, pure water, and the gas supplied to the spray nozzle 22 is, for example, nitrogen gas. A liquid other than pure water may be supplied to the spray nozzle 22. Likewise, a gas other than nitrogen gas may be supplied to the spray nozzle 22.

The horizontal drive mechanism 24b includes an actuator which generates a motive force that moves the vertical drive mechanism 24a and a transmission mechanism which transmits the motive force of the actuator to the vertical drive mechanism 24a. As shown in FIG. 2, the horizontal drive mechanism 24b is a slide mechanism which moves the brush 21 and the spray nozzle 22 horizontally along a linear path P1 that passes through the central portion of the substrate W in a plan view. The horizontal drive mechanism 24b may be a pivot mechanism which moves the brush 21 and the spray nozzle 22 horizontally along an arc-shaped path which passes through the central portion of the substrate W in a plan view.

The horizontal drive mechanism 24b can make the brush 21 and the spray nozzle 22 stationary in an arbitrary position on the path P1. A standby position Ps, a center position Pc and an outer circumferential position Pe are each positions on the path P1. The standby position Ps is a position in which the brush 21 is located around the cup 9 in a plan view. The center position Pc is a position in which the brush 21 overlaps the central portion of the substrate W in a plan view. The outer circumferential position Pe is a position in which the brush 21 overlaps the outer circumferential portion of the substrate W. The outer circumferential position Pe may be located on the side of the standby position Ps with respect to the center position Pc or may be located on the side opposite to the standby position Ps with respect to the center position Pc.

The center position Pc includes a central upper position in which the lower surface 21a of the brush 21 is separated upward from the upper surface of the substrate W and a central lower position in which the lower surface 21a of the brush 21 is brought into contact with the upper surface of the substrate W. Likewise, the outer circumferential position Pe includes an outer circumferential upper position in which the lower surface 21a of the brush 21 is separated upward from the upper surface of the substrate W and an outer circumferential lower position in which the lower surface 21a of the brush 21 is brought into contact with the upper surface of the substrate W. The central upper position and the central lower position are positions which overlap each other in a plan view, and the outer circumferential upper position and the outer circumferential lower position are positions which overlap each other in a plan view. The standby position Ps includes a standby upper position in which the central upper position and the outer circumferential upper position are equal in height and a standby lower position which is located below the standby upper position.

The vertical drive mechanism 24a includes an actuator which generates a motive force that moves the movable arm 23 and a transmission mechanism which transmits the motive force of the actuator to the movable arm 23. The vertical drive mechanism 24a can make the brush 21 and the spray nozzle 22 stationary in an arbitrary position from the central upper position to the central lower position. Likewise, the vertical drive mechanism 24a can make the brush 21 and the spray nozzle stationary in an arbitrary position from the outer circumferential upper position to the outer circumferential lower position, and can make the brush 21 and the spray nozzle 22 stationary in an arbitrary position from the standby upper position to the standby lower position.

As shown in FIG. 2, the processing unit 2 includes a tubular standby pod 31 which houses the brush 21 located in the standby lower position. The standby pod 31 is arranged around the cup 9 in a plan view. The standby pod 31 is arranged below the brush 21 located in the standby upper position. Even when the brush 21 is arranged either in the standby upper position or in the standby lower position, the brush 21 overlaps the standby pod 31 in a plan view.

The standby pod 31 includes a plurality of cleaning liquid discharge ports 31a through which a cleaning liquid is discharged toward a space within the standby pod 31 and a cleaning liquid flow path 31b which guides the cleaning liquid to the cleaning liquid discharge ports 31a. The cleaning liquid flow path 31b is connected to a cleaning liquid pipe 33 in which a cleaning liquid valve 32 is interposed. The cleaning liquid is, for example, pure water. The cleaning liquid is not limited to pure water, and may be any one of carbonated water, electrolyzed ionic water, hydrogen water, ozone water and hydrochloric acid water of a diluted concentration (for example, about 10 to 100 ppm). The cleaning liquid may be a liquid which is the same type of liquid as the rinse liquid or may be a liquid which is a different type of liquid from the rinse liquid.

The brush 21, the spray nozzle 22 and a configuration related thereto will then be described in detail with reference to FIGS. 3A to 3C.

FIG. 3A is a partial cross-sectional view of the brush 21 and the spray nozzle 22, viewed horizontally. FIG. 3B is a schematic view of the brush 21, viewed vertically from below. FIG. 3C is a schematic view of the movable arm 23, viewed in an axial direction of a bolt 47. In FIG. 3B, the liquid discharge port 22a and the gas discharge port 22b are shown in black.

As shown in FIG. 3, the movable arm 23 includes a brush arm 43 which holds the brush 21, a nozzle arm 42 which holds the spray nozzle 22 and a main arm 41 which holds the brush arm 43 and the nozzle arm 42. The main arm 41 includes a horizontal portion 41a which is extended horizontally and a vertical portion 41b which is extended from the tip end of the horizontal portion 41a vertically downward. The brush arm 43 and the nozzle arm 42 are extended horizontally in a direction opposite to the horizontal portion 41a with respect to the vertical portion 41b. The brush arm 43 is arranged below the nozzle arm 42, and overlaps the nozzle arm 42 in a plan view.

The spray nozzle 22 is inserted into a through hole 42h which vertically penetrates the nozzle arm 42, and is fixed to the nozzle arm 42. The spray nozzle 22 is further inserted into a through hole 43h which vertically penetrates the brush arm 43, and is protruded downward from the brush arm 43. The brush 21 is arranged below the brush arm 43. The lower end portion of the spray nozzle 22 is arranged within the brush 21.

The brush 21 is supported by the brush arm 43 through a holder 45 and a holder attachment portion 44. The holder attachment portion 44 is fixed to the brush arm 43. The holder 45 is removably attached to the holder attachment portion 44. The holder 45 includes a cylindrical circumferential wall portion 45a which surrounds the brush 21 and an annular bottom wall portion 45b which is extended inward from the lower end of the circumferential wall portion 45a. The brush 21 is protruded downward from the bottom wall portion 45b.

The brush 21 is an elastically deformed columnar sponge which is defined of a synthetic resin such as PVA (polyvinyl alcohol) or urethane. The brush 21 includes the lower surface 21a which is pressed against the upper surface of the substrate W, a central opening 21b which is open in the central portion of the lower surface 21a and the nozzle insertion hole 21c which is extended upward from the central opening 21b. The lower surface 21a of the brush 21 may be a flat horizontal surface or a hemispherical surface which is convex downward. As shown in FIG. 3B, when the brush 21 is seen vertically from below, the lower surface 21a of the brush 21 is annular.

As shown in FIG. 3A, the spray nozzle 22 is inserted into a through hole 44h which vertically penetrates the holder attachment portion 44. The spray nozzle 22 is further inserted into a nozzle insertion hole 21c which penetrates the brush 21 in an up/down direction. The lower end portion of the spray nozzle 22 is arranged within the nozzle insertion hole 21c. The lower surface 21a of the brush 21 is arranged lower than the lower end portion of the spray nozzle 22. As shown in FIG. 3B, when the brush 21 is seen vertically from below, the liquid discharge port 22a and the gas discharge port 22b of the spray nozzle 22 are exposed from the brush 21.

The inside diameter of the through hole 44h of the holder attachment portion 44 is larger than the outside diameter of the spray nozzle 22. Likewise, the inside diameter of the nozzle insertion hole 21c is larger than the outside diameter of the spray nozzle 22. The holder attachment portion 44 and the brush 21 can be moved vertically with respect to the spray nozzle 22. The inside diameter of the nozzle insertion hole 21c may be substantially equal to the outside diameter of the spray nozzle 22. This is because even if the inside diameter of the nozzle insertion hole 21c is slightly smaller than the outside diameter of the spray nozzle 22, when the spray nozzle 22 is attempted to be inserted into the nozzle insertion hole 21c, the inside diameter of the nozzle insertion hole 21c is extended due to the elastic deformation of the brush 21.

As shown in FIG. 3A, the root portion of the brush arm 43 is inserted into a slide groove 46 provided in the main arm 41. The slide groove 46 is concave horizontally and is extended vertically. The root portion of the brush arm 43 can be moved vertically along the slide groove 46. The brush arm 43 is fixed to the main arm 41 with the bolt 47. The head portion 47a of the bolt 47 is arranged on a side opposite to the brush arm 43 with respect to the main arm 41. The shaft portion 47b of the bolt 47 is inserted into a bolt hole 41h which horizontally penetrates the main arm 41. The shaft portion 47b of the bolt 47 is attached to a female screw hole 43h provided in the brush arm 43. Thereby, the brush arm 43 is fastened to the main arm 41.

As shown in FIG. 3C, the bolt hole 41h of the main arm 41 is a long hole which is extended vertically. The length of the bolt hole 41h in the horizontal direction is larger than the outside diameter of the shaft portion 47b of the bolt 47 but smaller than the outside diameter of the head portion 47a of the bolt 47. The length of the bolt hole 41h in the vertical direction is larger than the outside diameter of the head portion 47a of the bolt 47. The bolt 47 is loosened, and thus the bolt 47 can be moved vertically with respect to the main arm 41. Thereafter, the bolt 47 is tightened, and thus the brush arm 43 can be fixed. Thereby, the position of the brush 21 with respect to the main arm 41 can be changed in the vertical direction, and thus it is possible to change a difference in height between the lower surface 21a of the brush 21 and the lower end portion of the spray nozzle 22.

Figure 4A:
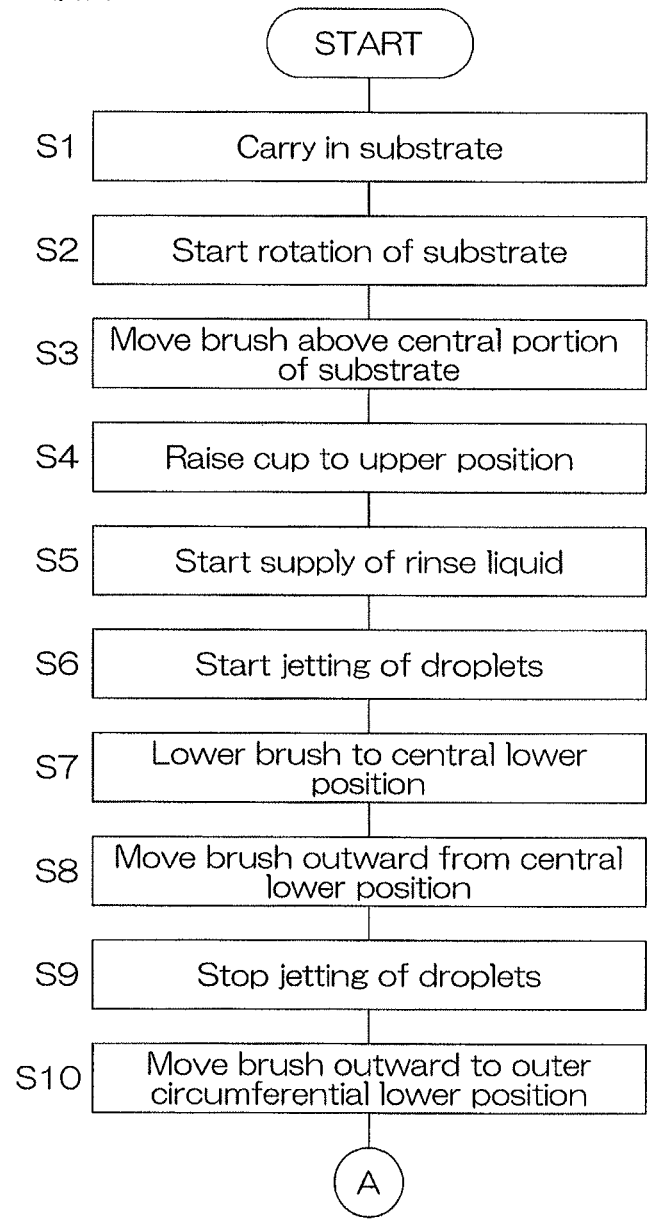
FIG. 4A is a process diagram for describing an example of a processing of a substrate performed by the substrate processing apparatus.
Figure 5A:
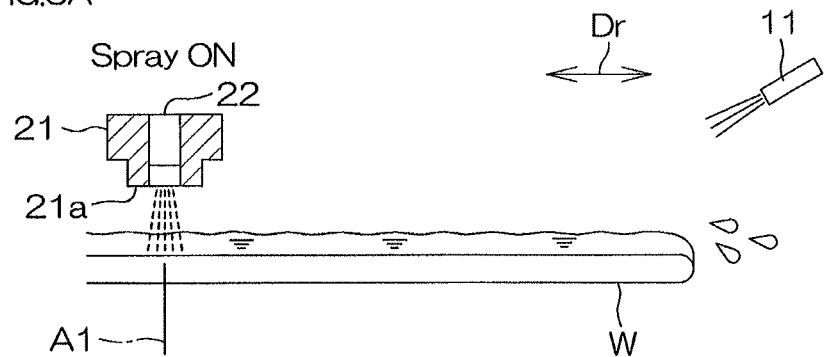
FIG. 5A is a schematic view showing the state of the substrate when the processing is being performed.

FIGS. 4A and 4B are process diagrams for describing an example of processing on the substrate W performed by the substrate processing apparatus 1. FIGS. 5A to 5J are schematic views showing the state of the substrate W when the processing shown in FIGS. 4A and 4B is being performed. A description will be given below with reference to FIG. 1. FIGS. 4A, 4B and 5A and the like will be referenced as necessary. Steps which will be described below are performed by control of the substrate processing apparatus 1 with the controller 3. In other words, the controller 3 is programmed so as to perform the steps below.

When the substrate W is processed by the substrate processing apparatus 1, the brush 21 and the spray nozzle 22 are retracted from above the substrate W, and in a state where the cup 9 is located in the lower position, the transfer robot (unillustrated) makes a hand enter into the chamber 4 while the substrate W is being supported by the hand. Thereafter, the transfer robot places, on the spin chuck 5, the substrate W on the hand in a state where the front surface or the rear surface of the substrate W is directed upward (step S1). After the substrate W is gripped by the check pins 6, the spin motor 8 starts rotation of the substrate W (step S2). The transfer robot places the substrate W on the spin chuck 5, and thereafter retracts the hand from the interior of the chamber 4.

After the substrate W is placed on the spin chuck 5, the drive mechanism 24 moves the brush 21 and the spray nozzle 22 from the standby lower position to a central intermediate position (position shown in FIG. 5A) between the central upper position and the central lower position (step S3). Furthermore, the cup raising/lowering unit 10 raises the cup 9 from the lower position to the upper position (step S4). Thereafter, the rinse liquid valve 12 is opened, and thus the rinse liquid nozzle 11 starts the discharge of the pure water toward the central portion of the upper surface of the substrate W (step S5). The pure water which reaches the upper surface of the rotating substrate W is made to flow outward along the upper surface of the substrate W by a centrifugal force so as to be scattered outward from the outer circumferential portion of the substrate W. Thereby, the pure water is supplied to each portion of the upper surface of the substrate W so as to define a liquid film of the pure water which covers the entire upper surface of the substrate W.

Figure 5B:
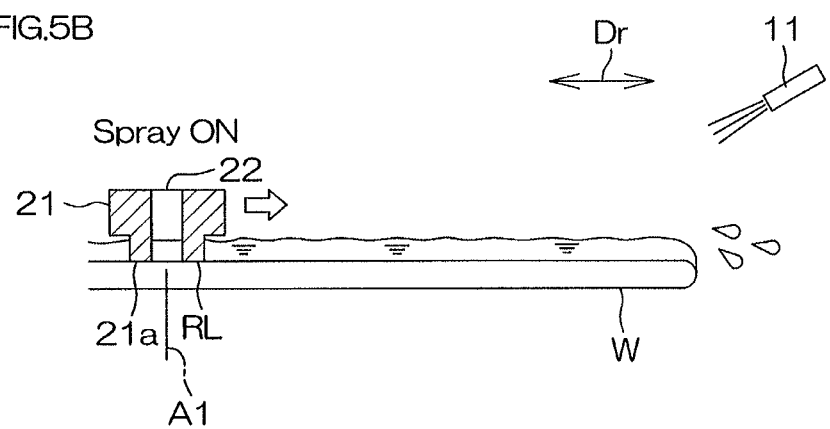
FIG. 5B is a schematic view showing the state of the substrate when the processing is being performed.

Next, as shown in FIG. 5A, in a state where the brush 21 and the spray nozzle 22 are located in the central intermediate position, the liquid valve 25 and the gas valve 27 are opened, and thus the spray nozzle 22 starts jetting of a plurality of droplets (step S6). The droplets penetrate the liquid film of the pure water which covers the central portion of the upper surface of the substrate W, and collide with the central portion of the upper surface of the substrate W. As shown in FIG. 5B, in this state, the drive mechanism 24 lowers the brush 21 and the spray nozzle 22 from the central intermediate position to the central lower position (position shown in FIG. 5B) (step S7). In the meantime, the lower surface 21a of the brush 21 is pressed through the liquid film of the pure water against the central portion of the upper surface of the substrate W so as to be brought into contact with a landing region RL within the upper surface of the substrate W.

Figure 5C:
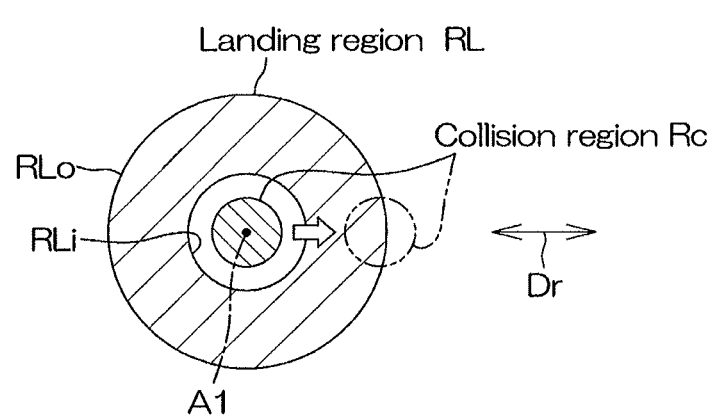
FIG. 5C is a schematic view showing the state of the substrate when the processing is being performed.

Then, in a state where the spray nozzle 22 jets the droplets, and where the lower surface 21a of the brush 21 is pressed against the upper surface of the substrate W, the drive mechanism 24 moves the brush 21 and the spray nozzle 22 outward in a radial direction Dr (step S8). As shown in FIG. 5C, a collision region Rc within the upper surface of the substrate W, that is, a region with which the droplets collide is passed through the inner edge RLi of the landing region RL as the spray nozzle 22 is moved in the radial direction Dr. Then, when the collision region Rc reaches the outer edge RLo of the landing region RL, the liquid valve 25 and the gas valve 27 are closed, and thus the spray nozzle 22 stops jetting of the droplets (step S9). In the meantime, the droplets collide with each portion of the landing region RL so as to remove contamination which is transferred from the brush 21 to the landing region RL.

As shown in FIGS. 5D and 5E, after jetting of the droplets is stopped, in a state where the lower surface 21a of the brush 21 is pressed against the upper surface of the substrate W, the drive mechanism 24 moves the brush 21 and the spray nozzle 22 up to the outer circumferential lower position (position shown in FIG. 5E) outward in the radial direction Dr (step S10). Thereby, the lower surface 21a of the brush 21 is scrubbed on each portion of the upper surface of the substrate W, and thus the upper surface of the substrate W is cleaned with the brush 21.

As shown in FIG. 5F, when the brush 21 and the spray nozzle 22 reach the outer circumferential lower position, the liquid valve 25 and the gas valve 27 are opened in a state where the lower surface 21a of the brush 21 is in contact with the upper surface of the substrate W, and thus the spray nozzle 22 starts jetting of the droplets (step S11). Since the brush 21 is a porous sponge, some of the fluid within the nozzle insertion hole 21c is discharged to the outside of the brush 21 not through the central opening 21b of the brush 21 but through the surface of the brush 21. However, when the fluid is supplied into the nozzle insertion hole 21c in a state where the central opening 21b of the brush 21 is closed, the pressure within the nozzle insertion hole 21c is increased.

As shown in FIG. 5G, after the spray nozzle 22 starts jetting of the droplets, the drive mechanism 24 raises the brush 21 and the spray nozzle 22 from the outer circumferential lower position to a lower non-contact position (position shown in FIG. 5G) between the outer circumferential lower position and the outer circumferential upper position (step S12). Thereby, the lower surface 21a of the brush 21 is separated upward from a takeoff region Rt which is a region within the outer circumferential portion of the upper surface of the substrate W. A distance from the lower surface 21a of the brush 21 located in the lower non-contact position to the upper surface of the substrate W in the vertical direction is smaller than, for example, the outside diameter of the lower surface 21a of the brush 21. This distance may be smaller than the diameter of the central opening 21b of the brush 21.

Since the pressure within the nozzle insertion hole 21c is increased, the drive mechanism 24 raises the brush 21 and the spray nozzle 22 from the outer circumferential lower position to the lower non-contact position, and thus the gas and the liquid within the nozzle insertion hole 21c are discharged downward from the central opening 21b of the brush 21 by the pressure within the nozzle insertion hole 21c so as to be scattered radially through a gap between the lower surface 21a of the brush 21 and the upper surface of the substrate W. The gas and the liquid which are rapidly passed through the gap collide with contamination adhering to the lower surface 21a of the brush 21 and the upper surface of the substrate W. Thereby, it is possible to reduce the remaining amount of contamination on the lower surface 21a of the brush 21 and the upper surface of the substrate W.

Even after the drive mechanism 24 raises the brush 21 and the spray nozzle 22 to the lower non-contact position, the spray nozzle 22 continues jetting of the droplets. Here, the collision region Rc within the upper surface of the substrate W with which the droplets collide is located in the outer circumferential portion of the upper surface of the rotating substrate W. Hence, the droplets collide with the entire circumference of the takeoff region Rt. Thereby, the contamination left on the region when the brush 21 is separated from the takeoff region Rt is removed from the substrate W due to an impact caused by the collision of the droplets.

The droplets which collide with the upper surface of the substrate W flow radially through the gap between the lower surface 21a of the brush 21 and the upper surface of the substrate W even after the lower surface 21a of the brush 21 is separated from the upper surface of the substrate W and the pressure within the nozzle insertion hole 21c is released. The lower non-contact position may be a position in which the gap between the lower surface 21a of the brush 21 and the upper surface of the substrate W is filled with the liquid or may be a position in which the liquid flowing through the gap is intermittently brought into contact with the lower surface 21a of the brush 21. In either case, the liquid flowing outward is supplied to the lower surface 21a of the brush 21, and thus it is possible to reduce the remaining amount of contamination on the lower surface 21a of the brush 21.

As shown in FIG. 5H, the drive mechanism 24 makes the brush 21 and the spray nozzle 22 stationary in the lower non-contact position, and thereafter in a state where the spray nozzle 22 jets the droplets, the drive mechanism 24 raises the brush 21 and the spray nozzle 22 from the lower non-contact position to an upper non-contact position (position shown in FIG. 5H) (step S13). The upper non-contact position is a position which is above the lower non-contact position. The upper non-contact position may be the outer circumferential upper position. A distance from the lower surface 21a of the brush 21 arranged in the upper non-contact position to the upper surface of the substrate W in the vertical direction may be equal to or more than the radius of the central opening 21b.

When the brush 21 and the spray nozzle 22 are arranged in the upper non-contact position, the spray nozzle 22 is moved upward away from the upper surface of the substrate W. The droplets are scattered downward while being extended conically from the lower end portion of the spray nozzle 22. The spray nozzle 22 is moved away from the substrate W, and thus the outside diameter of the collision region Rc within the upper surface of the substrate W with which the droplets collide is increased. Even when the brush 21 and the spray nozzle 22 are arranged in the upper non-contact position, the substrate W is rotated. Hence, it is possible to make the droplets collide with a wider range within the upper surface of the substrate W, and thus it is possible to reduce the leftover amount of contamination transferred from the lower surface 21a of the brush 21 to the upper surface of the substrate W.

As shown in FIG. 5I, the brush 21 and the spray nozzle 22 are made stationary in the upper non-contact position, thereafter the liquid valve 25 and the gas valve 27 are closed and thus the spray nozzle 22 stops jetting of the droplets (step S14). Thereafter, the drive mechanism 24 moves the brush 21 and the spray nozzle 22 from the upper non-contact position to the central intermediate position inward in the radial direction Dr (step S15). Then, as necessary, a series of steps from step S6 to step S15 are performed one or more times (step S16). However, during the last time, the brush 21 and the spray nozzle 22 are moved to the standby position without being moved to the central intermediate position (step S17).

Figure 5J:
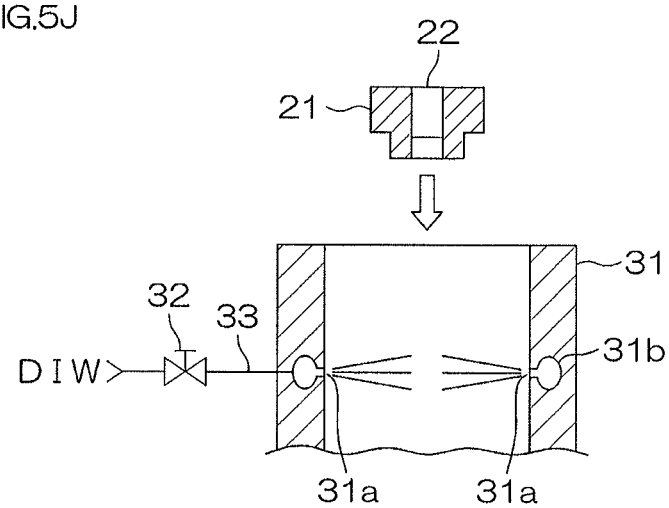
FIG. 5J is a schematic view showing the state of the substrate when the processing is being performed.

As shown in FIG. 5J, the cleaning liquid valve 32 which switches the discharge of the pure water from the cleaning liquid discharge ports 31a of the standby pod 31 is opened before the brush 21 and the spray nozzle 22 reach the standby lower position. Thereby, the cleaning liquid discharge ports 31a start the discharge of the pure water. In a state where the cleaning liquid discharge ports 31a discharge the pure water, the drive mechanism 24 inserts the brush 21 from above the standby pod 31 into the standby pod 31. Furthermore, the drive mechanism 24 reciprocates the brush 21 within the standby pod 31 in the vertical direction one or more times. The position in which the pure water is supplied to the brush 21 is moved in the vertical direction as the brush 21 is raised or lowered. Thereby, the contamination adhering to the brush 21 is cleaned away, and thus the remaining amount of contamination is reduced (step S18).

Even after the brush 21 is separated from the substrate W, the rinse liquid nozzle 11 continues the discharge of the pure water. Hence, the entire upper surface of the substrate W is covered with the liquid film of the pure water. After the rinse liquid valve 12 is closed (step S19), and the rinse liquid nozzle 11 stops the discharge of the pure water, the spin motor 8 accelerates the substrate W in the rotation direction, and thus the substrate W is rotated at a higher rotation speed (for example, a few thousand rpm) than the previous rotation speed. The liquid on the substrate W is scattered by a centrifugal force from the substrate W to the surrounding thereof so as to be removed from the substrate W. Thereby, the substrate W is dried (step S20). When a predetermined time has elapsed since the start of the high-speed rotation of the substrate W, the rotation of the spin motor 8 is stopped (step S21). Thereby, the rotation of the substrate W is stopped.

After the stop of the rotation of the substrate W, the cup raising/lowering unit 10 lowers the cup 9 to the lower position (step S22). Thereafter, the transfer robot (unillustrated) makes the hand enter into the chamber 4. After the check pins 6 release the gripping of the substrate W, the transfer robot supports the substrate W on the spin chuck 5 with the hand. Thereafter, the transfer robot retracts the hand from the interior of the chamber 4 while supporting the substrate W with the hand. Thereby, the processed substrate W is transported out of the chamber 4 (step S23).

As described above, in the present preferred embodiment, the brush 21 and the spray nozzle 22 are moved downward toward the central lower position. Thereby, the lower surface 21a of the brush 21 approaches the upper surface of the substrate W and then comes into contact with the landing region RL within the upper surface of the substrate W. Thereafter, in a state where the substrate W is rotated about the vertical rotation axis A1, and where the lower surface 21a of the brush 21 is brought into contact with the upper surface of the substrate W, the brush 21 is moved from the central lower position to the outer circumferential lower position in the radial direction Dr. Thereby, the lower surface 21a of the brush 21 is scrubbed on the upper surface of the substrate W, and thus the upper surface of the substrate W is cleaned with the brush 21.

Thereafter, the brush 21 and the spray nozzle 22 are moved upward from the outer circumferential lower position to the lower non-contact position. Thereby, the lower surface 21a of the brush 21 is separated from the takeoff region Rt within the upper surface of the substrate W. In this state, the spray nozzle 22 generates the droplets. The droplets are passed downward through the central opening 21b which is open in the lower surface 21a of the brush 21 so as to collide with the takeoff region Rt within the upper surface of the substrate W. The contamination left on the takeoff region Rt when the brush 21 is separated from the substrate W is removed from the substrate W due to the impact caused by the collision of the droplets.

The droplets generated by the spray nozzle 22 collide with the upper surface of the substrate W, and are thereafter passed outward through the gap between the lower surface 21a of the brush 21 and the upper surface of the substrate W. Some of the liquid which is passed through the gap is supplied to the lower surface 21a of the brush 21. Thereby, the contamination adhering to the lower surface 21a of the brush 21 is cleaned away. Furthermore, the droplets collide with the collision region Rc within the upper surface of the substrate W, and are thereafter extended radially from the collision region Rc. In other words, the liquid colliding with the substrate W is extended from the collision region Rc in a plurality of directions. Hence, as compared with a case where the liquid flows only in one direction, the contamination can be removed from a wider range within the lower surface 21a of the brush 21.

As described above, the contamination adhering to the lower surface 21a of the brush 21 can be cleaned away such that the remaining amount of contamination can be reduced. Thereafter, when the brush 21 is brought into contact with the subsequent substrate W, it is possible to reduce the amount of contamination transferred from the lower surface 21a of the brush 21 to the landing region RL within the upper surface of the substrate W. Furthermore, the lower surface 21a of the brush 21 is separated from the upper surface of the substrate W, and thereafter the droplets collide with the takeoff region Rt within the upper surface of the substrate W. It is therefore possible to reduce the remaining amount of contamination on the takeoff region Rt. Thereby, it is possible to reduce the remaining amount of contamination on the upper surface of the substrate W and to enhance the cleanliness of the substrate W.

In the present preferred embodiment, in a state where the lower surface 21a of the brush 21 is in contact with the upper surface of the substrate W, the spray nozzle 22 generates the droplets. When the lower surface 21a of the brush 21 is in contact with the upper surface of the substrate W, since the central opening 21b which is open in the lower surface 21a of the brush 21 is closed by the upper surface of the substrate W, the droplets are generated within the nozzle insertion hole 21c, and thus the pressure within the nozzle insertion hole 21c is increased. Hence, the lower surface 21a of the brush 21 is separated upward from the upper surface of the substrate W in a state where the pressure within the nozzle insertion hole 21c is high.

When the lower surface 21a of the brush 21 is separated from the upper surface of the substrate W, the liquid within the nozzle insertion hole 21c is discharged by the pressure within the nozzle insertion hole 21c downward from the central opening 21b of the brush 21 and is scattered radially through the gap between the lower surface 21a of the brush 21 and the upper surface of the substrate W. The liquid which is rapidly passed through the gap between the brush 21 and the substrate W collides with the contamination adhering to the lower surface 21a of the brush 21 and the upper surface of the substrate W. Thereby, it is possible to remove the contamination adhering to the lower surface 21a of the brush 21 and the upper surface of the substrate W, and thus it is possible to reduce the remaining amount of contamination thereon.

In the present preferred embodiment, while the brush 21 and the spray nozzle 22 are located in the upper non-contact position above the lower non-contact position, the droplets are generated by the spray nozzle 22. In general, the droplets are not scattered linearly from the lower end portion of the spray nozzle 22 but scattered downward while being extended conically from the lower end portion of the spray nozzle 22. As the spray nozzle 22 is moved away from the substrate W, the outside diameter of the collision region Rc within the upper surface of the substrate W with which the droplets collide is increased. Hence, the spray nozzle 22 is located in the upper non-contact position, and thus it is possible to make the droplets collide with a wider range within the upper surface of the substrate W and to reduce the amount of contamination transferred from the lower surface 21a of the brush 21 to the upper surface of the substrate W.

In the present preferred embodiment, while the droplets are being generated by the spray nozzle 22, the brush 21 and the spray nozzle 22 are moved from the central lower position toward the outer circumferential lower position in the radial direction Dr. When the brush 21 is located in the central lower position, the lower surface 21a of the brush 21 is in contact with the landing region RL within the upper surface of the substrate W. Here, the contamination left on the lower surface 21a of the brush 21 can be transferred to the landing region RL. The collision region Rc within the upper surface of the substrate W with which the droplets collide overlaps the landing region RL as the spray nozzle 22 is moved in the radial direction Dr. The contamination transferred from the brush 21 to the landing region RL is removed due to the impact caused by the collision of the droplets. Thereby, it is possible to reduce the remaining amount of contamination on the upper surface of the substrate W and to enhance the cleanliness of the substrate W.

In the present preferred embodiment, the collision region Rc with which the droplets collide is moved in the radial direction Dr within the upper surface of the substrate W. The landing region RL with which the lower surface 21a of the brush 21 is brought into contact when the brush 21 and the spray nozzle 22 are arranged in the central lower position is an annular region that surrounds the collision region Rc. The collision region Rc is passed through the inner edge of the central lower position as the spray nozzle 22 is moved in the radial direction Dr. The generation of the droplets is continued at least until the collision region Rc reaches the outer edge RLo of the landing region RL. Hence, it is possible to make the droplets collide with each portion of the landing region RL, and thus it is possible to reduce the remaining amount of contamination on the upper surface of the substrate W.

In the present preferred embodiment, before the brush 21 is brought into contact with the upper surface of the substrate W, the spray nozzle 22 starts the generation of the droplets. In this state, the brush 21 and the spray nozzle 22 are lowered to the central lower position. Furthermore, the brush 21 and the spray nozzle 22 are moved from the central lower position toward the outer circumferential lower position in the radial direction Dr. Hence, as compared with a case where the generation of the droplets is started after the brush 21 and the spray nozzle 22 are moved to the central lower position, the brush 21 and the spray nozzle 22 can be smoothly moved from the central lower position to the outer circumferential lower position.

In the present preferred embodiment, in a state where the lower surface 21a of the brush 21 is in contact with the upper surface of the substrate W, and where the spray nozzle 22 stops the generation of the droplets, the brush 21 and the spray nozzle 22 are moved in the radial direction Dr. When the spray nozzle 22 generates droplets while the lower surface 21a of the brush 21 is in contact with the upper surface of the substrate W, the pressure within the nozzle insertion hole 21c provided in the brush 21 is increased and a force which raises the brush 21 from the substrate W can be generated. This means that a force which presses the brush 21 against the substrate W is reduced. Hence, while the generation of the droplets is stopped, the brush 21 is pressed against the upper surface of the substrate W, and thus it is possible to reduce or prevent the lowering of the removal rate of the contamination.

Other Preferred Embodiments

The present invention is not limited to the contents of the above described preferred embodiments and various modifications are possible.

For example, the brush 21 is not limited to a sponge brush, and the brush 21 may be a brush which has a plurality of fibers made of synthetic resin.

The spray nozzle 22 may be a nozzle other than the two-fluid nozzle. For example, the spray nozzle 22 may include a plurality of liquid discharge ports which individually jet a plurality of droplets.

A protective liquid nozzle (so-called cover rinse nozzle) which is separate from the rinse liquid nozzle 11 may be provided in the processing unit 2. The protective liquid nozzle is a nozzle which discharges a protective liquid that covers the entire upper surface of the substrate W when the lower surface 21a of the brush 21 is scrubbed on the upper surface of the substrate W. The protective liquid may be the same type of liquid as the rinse liquid discharged from the rinse liquid nozzle 11 or may be a different type of liquid from the rinse liquid.

While the lower surface 21a of the brush 21 is in contact with the upper surface of the rotating substrate W, the brush 21 and the spray nozzle 22 may be moved from the outer circumferential lower position to the central lower position. For example, the brush 21 and the spray nozzle 22 may be reciprocated between the outer circumferential lower position and the central lower position. The brush 21 and the spray nozzle 22 may be moved from the outer circumference of the substrate W to the outer circumference of the substrate W such that the brush 21 and the spray nozzle 22 are passed through both ends of the diameter of the substrate W.

Not before the brush 21 and the spray nozzle 22 are moved upward from the outer circumferential lower position but after they are moved, jetting of the droplets may be started by the spray nozzle 22.

An after-takeoff step may be omitted in which, while the brush 21 and the spray nozzle 22 are located in the upper non-contact position, the droplets are jetted by the spray nozzle 22.

Not before the brush 21 and the spray nozzle 22 are moved to the central lower position but after they are moved, jetting of the droplets may be started by the spray nozzle 22.

Jetting of the droplets from the spray nozzle 22 may be started after the brush 21 and the spray nozzle 22 are moved to the outer circumferential lower position. Alternatively, the droplets may be constantly jetted by the spray nozzle 22. In other words, while the brush 21 and the spray nozzle 22 are being moved from the central lower position to the outer circumferential lower position, the droplets may be jetted by the spray nozzle 22.

Figure 6:
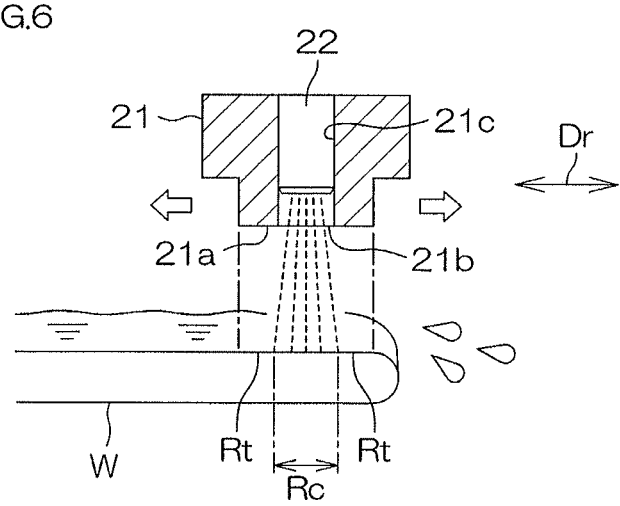
FIG. 6 is a schematic view showing the state of the substrate when another example of the processing of the substrate is being performed.

As shown in FIG. 6, the collision region Rc within the upper surface of the substrate W with which the droplets collide may be moved in the outer circumferential portion of the upper surface of the substrate W in the radial direction Dr.

For example, while in a state where the brush 21 and the spray nozzle 22 are located above the outer circumferential portion of the upper surface of the substrate W, the droplets are being jetted by the spray nozzle 22, the brush 21 and the spray nozzle 22 may be reciprocated in the radial direction Dr. Here, the brush 21 and the spray nozzle 22 may be arranged in the lower non-contact position or the upper non-contact position or may be arranged at a height different from those. With this arrangement, it is possible to make the droplets collide with a wider range within the upper surface of the substrate W including the takeoff region Rt, and thus it is possible to further reduce the remaining amount of contamination on the takeoff region Rt.

Figure 7A:
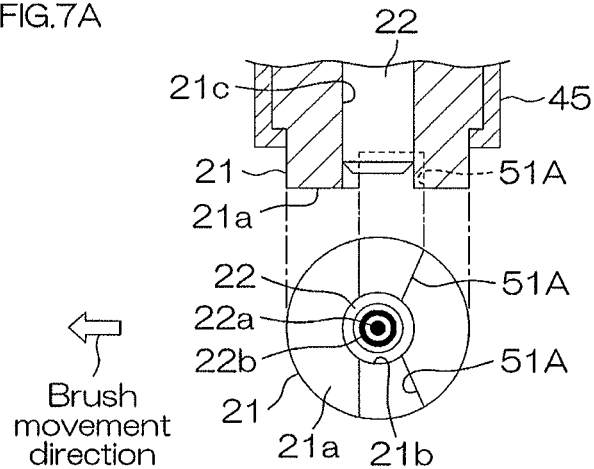
FIG. 7A is a schematic view showing a brush and a spray nozzle according to another preferred embodiment of the present invention.
Figure 7B:
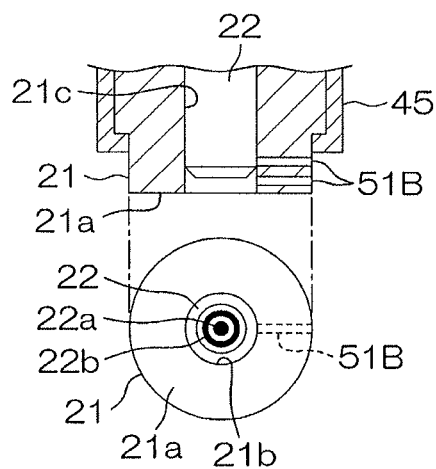
FIG. 7B is a schematic view showing a brush and a spray nozzle according to still another preferred embodiment of the present invention.
Figure 8:
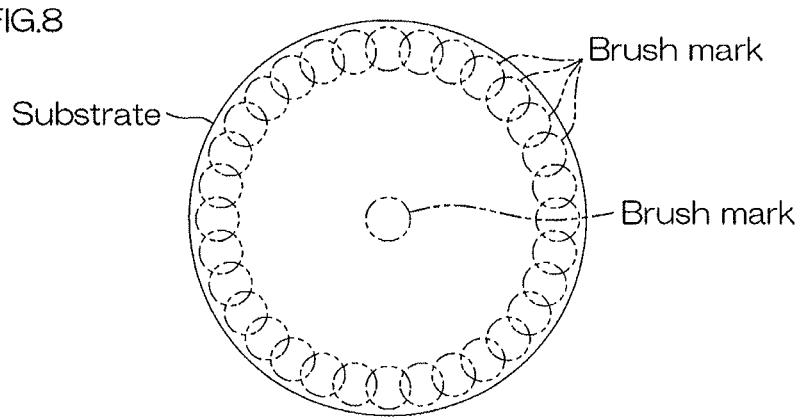
FIG. 8 is a schematic view showing a brush mark left on the upper surface of the substrate on which scrub cleaning has been performed.

As shown in FIGS. 7A and 7B, the brush 21 may further include at least one escape hole 51A or 51B which allows the fluid within the nozzle insertion hole 21c to escape to the outside of the brush 21.

FIGS. 7A and 7B show an example where the escape holes 51A and 51B are open in the inner circumferential surface of the nozzle insertion hole 21c and in the outer circumferential surface of the brush 21. As shown in FIG. 7A, the escape hole 51A may be open in the lower surface 21a of the brush 21. As shown in FIG. 7B, the escape hole 51B may not be open in the lower surface 21a of the brush 21. When the escape hole 51A is open in the lower surface 21a of the brush 21, in order to prevent the escape hole 51A from affecting the detergency of the brush 21, the escape hole 51A is preferably extended in a direction different from the movement direction of the brush 21.

According to the configuration shown in FIGS. 7A and 7B, the fluid within the nozzle insertion hole 21c provided in the brush 21 is discharged to the outside of the brush 21 not through the central opening 21b of the brush 21 but through the escape hole 51A or 51B. Hence, even when the droplets are generated by the spray nozzle 22 while the lower surface 21a of the brush 21 is in contact with the upper surface of the substrate W, it is unlikely that the pressure within the nozzle insertion hole 21c is increased. Thereby, it is possible to reduce or prevent a lowering in the detergency of the brush 21.

The substrate processing apparatus 1 is not limited to an apparatus that processes a disk-shaped substrate W and may be an apparatus that processes a polygonal substrate W.

Two or more of any of the arrangements described above may be combined. Two or more of any of the steps described above may be combined.

The present application corresponds to Japanese Patent Application No. 2017-045085 filed on Mar. 9, 2017 in the Japan Patent Office, and the entire disclosure of this application is incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing method performed by a substrate processing apparatus including: a brush which includes a lower surface that is pressed against an upper surface of a substrate held horizontally, a central opening that is open in a central portion of the lower surface and a nozzle insertion hole that is extended upward from the central opening; and a spray nozzle which is inserted into the nozzle insertion hole and which generates a plurality of droplets that are scattered toward the upper surface of the substrate through the central opening, the substrate processing method comprising:

a brush landing step of moving the brush and the spray nozzle downward to a landing position in which the lower surface of the brush comes into contact with the upper surface of the substrate;

a scrub cleaning step of moving the brush and the spray nozzle from the landing position to a takeoff position in a horizontal radial direction orthogonal to a vertical rotation axis passing through a central portion of the substrate while rotating the substrate about the rotation axis so as to move the lower surface of the brush along the upper surface of the substrate;

a brush takeoff step of moving the brush and the spray nozzle upward from the takeoff position to a lower non-contact position so as to separate the lower surface of the brush from the upper surface of the substrate;

a takeoff spray step of making the spray nozzle generate the droplets in a state where the brush and the spray nozzle are stationary at the lower non-contact position such that the droplets collide with the upper surface of the substrate, and then the droplets are discharged from a gap between the lower surface of the brush and the upper surface of the substrate after the droplets have flowed radially from the central opening in the gap while supplying the droplets that have collided with the upper surface of the substrate to the lower surface of the brush and removing contamination from the lower surface of the brush by the droplets supplied to the lower surface of the brush;

a brush raising step of moving the brush and the spray nozzle upward from the lower non-contact position to an upper non-contact position; and an after-takeoff spray step of making the spray nozzle generate the droplets in a state where the brush and the spray nozzle are located in the upper non-contact position, wherein a distance from the lower surface of the brush located in the lower non-contact position to the upper surface of the substrate in a vertical direction is smaller than a diameter of the central opening of the brush such that the gap between the lower surface of the brush and the upper surface of the substrate is filled with liquid generated by the droplets or the liquid flowing through the gap is intermittently brought into contact with the lower surface of the brush, and a distance from the lower surface of the brush located in the upper non-contact position to the upper surface of the substrate in the vertical direction is greater than the diameter of the central opening of the brush.

2. The substrate processing method according to claim 1, wherein the takeoff spray step includes a before-takeoff spray start step of making the spray nozzle start the generation of the droplets before the brush and the spray nozzle are moved upward from the takeoff position.

3. The substrate processing method according to claim 1, further comprising:

a moving spray step of moving the brush and the spray nozzle in the radial direction while making the spray nozzle generate the droplets in a state where the brush and the spray nozzle is disposed above a take-off region within the upper surface of the substrate from which the lower surface of the brush is separated upward.

4. The substrate processing method according to claim 1, further comprising:

a landing spray step of moving the brush and the spray nozzle from the landing position toward the takeoff position in the radial direction while making the spray nozzle generate the droplets.

5. The substrate processing method according to claim 4, wherein the landing spray step is a step of making the spray nozzle generate the droplets at least until a collision region within the upper surface of the substrate with which the droplets collide reaches an outer edge of a landing region within the upper surface of the substrate with which the lower surface of the brush is brought into contact when the brush and the spray nozzle are arranged in the landing position.

6. The substrate processing method according to claim 4, wherein the landing spray step includes a before-landing spray start step of making the spray nozzle start the generation of the droplets before the brush and the spray nozzle are moved to the landing position.

7. The substrate processing method according to claim 1, wherein the scrub cleaning step includes a spray-stop scrub cleaning step of moving the brush and the spray nozzle in the radial direction while making the spray nozzle stop the generation of the droplets in at least a portion of a range from the landing position to the takeoff position.

8. The substrate processing method according to claim 1, further comprising:

a fluid discharge step of discharging a fluid within the nozzle insertion hole through an escape hole which is extended from an inner circumferential surface of the nozzle insertion hole to an outer surface of the brush.

9. A substrate processing apparatus comprising:

a substrate holding unit which rotates a substrate about a vertical rotation axis passing through a central portion of the substrate while holding the substrate horizontally;

a brush which includes a lower surface that is pressed against an upper surface of the substrate held by the substrate holding unit, a central opening that is open in a central portion of the lower surface and a nozzle insertion hole that is extended upward from the central opening;

a spray nozzle which is inserted into the nozzle insertion hole and which generates a plurality of droplets that are scattered through the central opening toward the upper surface of the substrate held by the substrate holding unit;

a drive mechanism which moves the brush and the spray nozzle; and a controller which controls the spray nozzle and the drive mechanism, wherein the controller is configured and programmed to perform:

a brush landing step of making the drive mechanism move the brush and the spray nozzle downward to a landing position in which the lower surface of the brush comes into contact with the upper surface of the substrate held by the substrate holding unit;

a scrub cleaning step of making the drive mechanism move the brush and the spray nozzle from the landing position to a takeoff position in a horizontal radial direction orthogonal to the rotation axis while making the substrate holding unit rotate the substrate about the rotation axis so as to move the lower surface of the brush along the upper surface of the substrate held by the substrate holding unit;

a brush takeoff step of making the drive mechanism move the brush and the spray nozzle upward from the takeoff position to a lower non-contact position so as to separate the lower surface of the brush from the upper surface of the substrate held by the substrate holding unit;

a takeoff spray step of making the spray nozzle generate the droplets in a state where the brush and the spray nozzle are stationary at the lower non-contact position such that the droplets collide with the upper surface of the substrate held by the substrate holding unit, and then the droplets are discharged from a gap between the lower surface of the brush and the upper surface of the substrate after the droplets have flowed radially from the central opening in the gap while supplying the droplets that have collided with the upper surface of the substrate to the lower surface of the brush and removing contamination from the lower surface of the brush by the droplets supplied to the lower surface of the brush;

a brush raising step of making the drive mechanism move the brush and the spray nozzle upward from the lower non-contact position to an upper non-contact position; and an after-takeoff spray step of making the spray nozzle generate the droplets in a state where the brush and the spray nozzle are located in the upper non-contact position, wherein a distance from the lower surface of the brush located in the lower non-contact position to the upper surface of the substrate in a vertical direction is smaller than a diameter of the central opening of the brush such that the gap between the lower surface of the brush and the upper surface of the substrate is filled with liquid generated by the droplets or the liquid flowing through the gap is intermittently brought into contact with the lower surface of the brush, and a distance from the lower surface of the brush located in the upper non-contact position to the upper surface of the substrate in the vertical direction is greater than the diameter of the central opening of the brush.

10. The substrate processing apparatus according to claim 9, wherein the takeoff spray step includes a before-takeoff spray start step of making the spray nozzle start the generation of the droplets before the brush and the spray nozzle are moved upward from the takeoff position.

11. The substrate processing apparatus according to claim 9,
wherein the controller is configured and programmed to further perform:
a moving spray step of making the drive mechanism move the brush and the spray nozzle in the radial direction while making the spray nozzle generate the droplets in a state where the brush and the spray nozzle is disposed above a take-off region within the upper surface of the substrate from which the lower surface of the brush is separated upward.

12. The substrate processing apparatus according to claim 9,
wherein the controller is configured and programmed to further perform:
a landing spray step of making the drive mechanism move the brush and the spray nozzle from the landing position toward the takeoff position in the radial direction while making the spray nozzle generate the droplets.

13. The substrate processing apparatus according to claim 12,
wherein the landing spray step is a step of making the spray nozzle generate the droplets at least until a collision region within the upper surface of the substrate with which the droplets collide reaches an outer edge of a landing region within the upper surface of the substrate with which the lower surface of the brush is brought into contact when the brush and the spray nozzle are arranged in the landing position.

14. The substrate processing apparatus according to claim 12,
wherein the landing spray step includes a before-landing spray start step of making the spray nozzle start the generation of the droplets before the brush and the spray nozzle are moved to the landing position.

15. The substrate processing apparatus according to claim 9,
wherein the scrub cleaning step includes a spray-stop scrub cleaning step of making the drive mechanism move the brush and the spray nozzle in the radial direction while making the spray nozzle stop the generation of the droplets in at least a portion of a range from the landing position to the takeoff position.

16. The substrate processing apparatus according to claim 9,
wherein the brush further includes an escape hole which is extended from an inner circumferential surface of the nozzle insertion hole to an outer surface of the brush.

* * * * *